(12) United States Patent
Kim

(10) Patent No.: US 8,811,099 B2
(45) Date of Patent: Aug. 19, 2014

(54) PERIOD SIGNAL GENERATION CIRCUITS

(71) Applicant: SK hynix Inc., Icheon (KR)

(72) Inventor: Dong Kyun Kim, Cheongju-si (KR)

(73) Assignee: SK Hynix Inc., Icheon (KR)

( * ) Notice: Subject to any disclaimer, the term of this patent is extended or adjusted under 35 U.S.C. 154(b) by 35 days.

(21) Appl. No.: 13/716,034

(22) Filed: Dec. 14, 2012

(65) Prior Publication Data

US 2013/0315010 A1 Nov. 28, 2013

(30) Foreign Application Priority Data

May 25, 2012 (KR) .................. 10-2012-0056372

(51) Int. Cl.
| | |
|---|---|
| *G11C 7/22* | (2006.01) |
| *G11C 11/402* | (2006.01) |
| *G11C 5/14* | (2006.01) |
| *G11C 11/406* | (2006.01) |
| *G11C 7/00* | (2006.01) |

(52) U.S. Cl.
CPC ............ *G11C 11/4023* (2013.01); *G11C 5/147* (2013.01); *G11C 11/406* (2013.01); *G11C 11/40615* (2013.01); *G11C 7/00* (2013.01); *G11C 11/40626* (2013.01)

USPC ............................ 365/191; 365/212; 365/222

(58) Field of Classification Search
CPC ...................................................... G11C 7/222
USPC ......................................... 365/191, 212, 222
See application file for complete search history.

(56) References Cited

U.S. PATENT DOCUMENTS

| | | | | |
|---|---|---|---|---|
| 5,774,404 | A * | 6/1998 | Eto ................................ | 365/222 |
| 7,075,847 | B2 * | 7/2006 | Kim et al. ..................... | 365/222 |
| 7,538,619 | B2 * | 5/2009 | Kim ............................... | 331/1 A |
| 7,551,501 | B2 * | 6/2009 | Kim et al. ..................... | 365/211 |
| 8,054,141 | B2 | 11/2011 | Saw | |

FOREIGN PATENT DOCUMENTS

KR        1020080066249 A        7/2008

* cited by examiner

*Primary Examiner* — Son Mai

(57) ABSTRACT

A period signal generation circuit includes a period signal generator configured to alternately charge and discharge a control node according to a level of the control node to generate a period signal, a discharge controller configured to discharge a first current having a constant value from the control node in response to a temperature signal and discharge a second current varying according to an internal temperature thereof from the control node in response to the temperature signal, and a tester configured to control a charging speed and a discharging speed of the control node.

36 Claims, 12 Drawing Sheets

PERIOD SIGNAL GENERATION CIRCUITS

CROSS-REFERENCES TO RELATED APPLICATIONS

The present application claims priority under 35 U.S.C 119(a) to Korean Application No. 10-2012-0056372, filed on May 25, 2012, in the Korean Intellectual Property Office, which is incorporated herein by reference in its entirety as set forth in full.

BACKGROUND

In general, semiconductor memory devices may be categorized as either volatile or nonvolatile memory devices. While the volatile memory devices lose their stored data when power is interrupted, the nonvolatile memory devices retain their stored data even when power is interrupted. Volatile memory devices include dynamic random access memory (DRAM) devices and static random access memory (SRAM) devices. A unit cell of the SRAM devices may include a flip flop circuit (e.g., two cross-coupled inverters) and two switching elements. Thus, the SRAM cells may stably store their data as long as power is supplied. Meanwhile, a unit cell of the DRAM devices may include a cell transistor acing as a switching element and a cell capacitor acting as a data storage element. If the cell transistor is turned on, the cell capacitor will be charged through the cell transistor to store a data bit in the capacitor.

In the DRAM devices, leakage currents may occur through the cell transistors even though the cell transistors are turned off. Thus, the data (e.g., charges) stored in the capacitors may be lost as the time elapses. Thus, the cell capacitors need to be periodically recharged to retain their stored data.

The refresh operation may be categorized as either an auto-refresh operation or a self-refresh operation. The auto-refresh operation may be executed by refresh commands outputted from a memory controller, and the self-refresh operation may be executed by self-refresh signals which are internally generated in the DRAM devices.

The self-refresh operation may be periodically executed according to a refresh cycle time determined in the DRAM devices. The refresh cycle time may be determined by a data retention time corresponding to a maximum time that the cell capacitors can retain a minimum charge which is required to read a correct logic data. The data retention time may be influenced by leakage current characteristics of the cell transistors and the leakage current characteristics of the cell transistors may vary according to an internal temperature of the DRAM devices. Thus, the data retention time may be affected by the internal temperature of the DRAM devices.

As leakage currents increase with an increase of the internal temperature of the DRAM devices, the data retention time decreases with the increase of the internal temperature, and vice versa. Thus, a refresh circuit should be designed such that the refresh cycle time varies according to an internal temperature of the DRAM devices. That is, the refresh cycle time should be reduced to ensure successful operations of the DRAM device as the internal temperature of the DRAM device increases. On the other hand, the refresh cycle time should be increased to reduce the power consumption of the DRAM device as the internal temperature of the DRAM device decreases. Conventional DRAM devices include period signal generation circuits to control the refresh cycle time according to the internal temperature thereof.

FIG. 1 is a block diagram illustrating a conventional period signal generation circuit.

As illustrated in FIG. 1, the conventional period signal generation circuit includes a first oscillator 11, a second oscillator 12, a temperature sensor 13 and a selection output unit 14. The first oscillator 11 generates a first oscillating signal OSC1 having a steady period (e.g., a constant cycle time) regardless of an internal temperature of the period signal generation circuit. The second oscillator 12 generates a second oscillating signal OSC2 whose period varies according to the internal temperature. The temperature sensor 13 generates a temperature signal TS which transitions from one level to another level at a predetermined temperature. The selection output unit 14 receives the first and second oscillating signals OSC1 and OSC2 in response to the temperature signal TS and outputs a period signal PSRF. The selection output unit 14 outputs the first oscillating signal OSC1 as the period signal PSRF when the temperature signal TS is generated at a temperature below the predetermined temperature. On the other hand, the selection output unit 14 outputs the second oscillating signal OSC2 as the period signal PSRF when the temperature signal TS is generated at a temperature over the predetermined temperature.

As described above, the period signal PSRF outputted from the conventional period signal generation circuit uses the first oscillating signal OSC1 at a temperature below the predetermined temperature, and the second oscillating signal OSC2 at a temperature over the predetermined temperature. Thus, if a refresh cycle time is determined by the period signal PSRF, the refresh cycle time may be uniform or constant at a temperature below the predetermined temperature and the refresh cycle time may vary with a temperature when the temperature is higher than the predetermined temperature.

The selection output unit 14 may function as a comparator. That is, the selection output unit 14 may compare the period of the first oscillating signal OSC1 with the period of the second oscillating signal OSC2 in response to the temperature signal TS and may output any one of the first and second oscillating signals OSC1 and OSC2 as the period signal PSRF. Thus, the conventional period signal generation circuit requires two oscillators continuously generating oscillating signals with different characteristics. Moreover, when a difference between the periods of the first and second oscillating signals OSC1 and OSC2 is small, the selection output unit 14 acting as a comparator may malfunction and output a wrong oscillating signal.

SUMMARY

An embodiment of the present invention relates to a period signal generation circuit includes a control node, a period signal generator, a discharge controller, and a tester. The period signal generator is configured to generate a period signal by alternately charging and discharging the control node according to a potential level of the control node. The discharge controller is configured to discharge a first current having a substantially constant value from the control node in response to a temperature signal and discharge a second current varying according to an internal temperature thereof from the control node in response to the temperature signal. The tester is configured to control a charging speed or a discharging speed, or both, of the control node.

In an embodiment, the period signal generation circuit is part of a semiconductor memory device and the period signal is used to refresh memory cells in the semiconductor memory device. The semiconductor memory device is provided in a package and the internal temperature corresponds to a temperature within the package.

In an embodiment, a period signal generation circuit includes a period signal generator configured to generate a period signal by alternately charging and discharging a control node according to a level of the control node, a discharge controller configured to discharge a first current having a constant value from the control node in response to a temperature signal and discharge a second current varying according to an internal temperature thereof from the control node in response to the temperature signal, and a tester configured to control a charging speed and a discharging speed of the control node.

In another embodiment, a period signal generation circuit includes a period signal generator configured to generate a period signal by alternately charging and discharging a control node according to a level of the control node, a discharge controller configured to generate a first current and a second current discharged from the control node, and a tester configured to control a charging speed and a discharging speed of the control node. A total current of the first and second currents is substantially constant when an internal temperature of the discharge controller is below a predetermined temperature, and the total current of the first and second currents varies with the internal temperature when the internal temperature is equal to or over the predetermined temperature.

BRIEF DESCRIPTION OF THE DRAWINGS

Embodiments of the present invention will become more apparent in view of the attached drawings and accompanying detailed description.

DETAILED DESCRIPTION

Embodiments of the present invention will be described hereinafter with reference to the accompanying drawings. However, the embodiments described herein are for illustrative purposes only and are not intended to limit the scope of the present invention.

Figure 1:
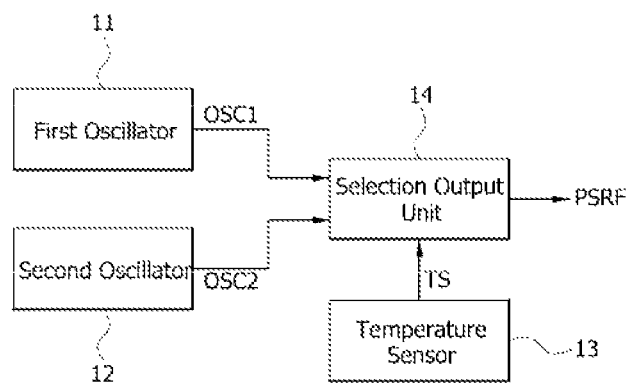
FIG. 1 is a block diagram illustrating a conventional period signal generation circuit.
Figure 2:
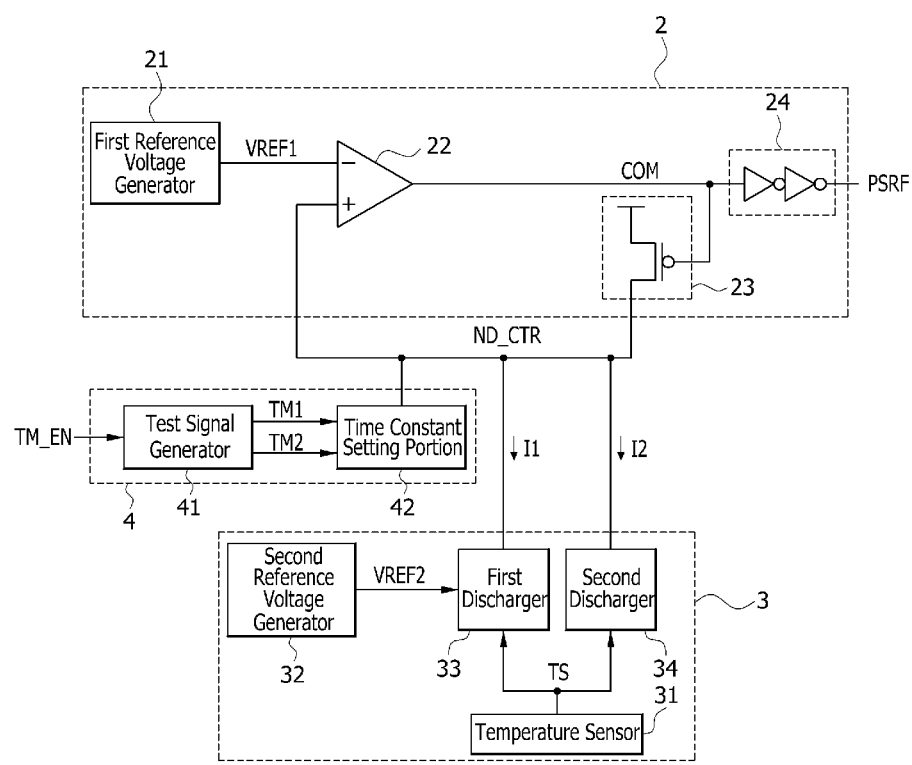
FIG. 2 illustrates a configuration of a period signal generation circuit according to an embodiment of the present invention.

FIG. 2 illustrates a configuration of a period signal generation circuit according to an embodiment of the present invention.

As illustrated in FIG. 2, a period signal generation circuit according to the present embodiment may be configured to include a period signal generator 2, a discharge controller 3 and a tester 4.

The period signal generator 2 may include a first reference voltage generator 21, a comparator 22, a driver 23 and a buffer 24. The first reference voltage generator 21 may generate a first reference voltage signal VREF1 having a first reference voltage with a constant level. The comparator 22 may compare a signal (e.g., a voltage signal) induced at a control node ND_CTR with the first reference voltage signal VREF1 to generate a comparison signal COM. The buffer 24 is configured to buffer the comparison signal COM to generate a period signal PSRF. The buffer may be a plurality of inverters and/or other components suitable for buffering and generating the period signal PSRF.

In an embodiment, the comparison signal COM is enabled initially to have a logic "low" state when the voltage of the control node ND_CTR has a lower level than the first reference voltage signal VREF1. Accordingly, a periodic signal PSRF is in a logic "low" state. The driver 23 receives the comparison signal COM having a logic "low" state to turn on the PMOS in the driver 23 for pulling up the voltage of the control node ND_CTR to a power supply voltage. As a result, the comparison signal COM is enabled to have a logic "high" state and the periodic signal PSRF having a logic "high" state is outputted. The PMOS of the driver 23 receives the logic "high" state and is turned off. The voltage of the control node ND_CTR is decreased until the voltage ND_CTR has a lower level than the first reference voltage signal VREF1, due to discharged currents from the control node ND_CTR as described below. Then, the comparison signal COM is enabled to have the logic "low" state once again. The periodic signals PSRF of "high" and "low" signals are generated in this manner.

The discharge controller 3 is configured to discharge the charges stored in the control node ND_CTR as needed. In an embodiment, the discharge controller 3 may include a temperature sensor 31, a second reference voltage generator 32, a first discharger 33 and a second discharger 34. The temperature sensor 31 may generate an output signal which transitions from one level to another level at a predetermined temperature. For example, the temperature sensor 31 may generate a temperature signal TS which transitions from a logic "high" state to a logic "low" state when an internal temperature of the period signal generation circuit reaches the predetermined temperature (e.g., 45 degrees Celsius) from a low temperature below the predetermined temperature. In other words, the temperature signal TS may have a logic "high" state when an internal temperature of the refresh circuit is below a predetermined temperature (e.g., 45 degrees Celsius) and may have a logic "low" state when the internal temperature of the refresh circuit is equal to or greater than the predetermined temperature. The second reference voltage generator 32 may generate a second reference voltage signal VREF2 having a variable voltage level that linearly varies according to a variation in the internal temperature or a constant voltage level regardless of a variation in the internal temperature. The first discharger 33 may discharge a first current I1, which is constant regardless of a variation in the internal temperature, from the control node ND_CTR in response to the second reference voltage signal VREF2. The second discharger 34 may discharge a second current I2, which is nonlinearly increased as the internal temperature increases, from the control node ND_CTR.

In an operation, one of the first and second dischargers 33 and 34 may selectively operate according to the temperature signal TS to discharge the charges stored in the control node ND_CTR. That is, the first discharger 33 may operate to generate the first current I1 from the control node ND_CTR when the temperature signal TS has a logic "high" state (e.g., when the internal temperature is below 45 degrees Celsius), and the second discharger 34 may operate to generate the second current I2 from the control node ND_CTR when the temperature signal TS has a logic "low" state (e.g., when the internal temperature is equal to or greater than 45 degrees Celsius).

The tester 4 is configured to control a charging speed and a discharging speed of the control node ND_CTR. In an embodiment, the tester 4 may include a test signal generator 41 and a time constant setting portion 42. The test signal generator 41 may generate a first test signal TM1 and a second test signal TM2 in response to a test enable signal TM_EN. For example, if the test enable signal TM_EN is enabled to have a logic "high" state, the test signal generator 41 may generate the first and second test signals TM1 and TM2 which are sequentially counted. On the other hand, if the test enable signal TM_EN is disabled to have a logic "low" state, the test signal generator 41 may generate the first and second test signals TM1 and TM2 having a logic "high" state. Accordingly, the first and second test signals TM1 and TM2 are sequentially counted from a logic "low, low" state to "high, high" state. The time constant setting portion 42 may control a charging speed that the voltage of the control node ND_CTR is pulled up to have a power supply voltage according to a time constant which is set by the first and second test signals TM1 and TM2. In addition, the time constant setting portion 42 may control a discharging speed that the voltage of the control node ND_CTR is pulled down by the discharge controller 3. The time constant may correspond to an RC delay time which is determined by a resistance value (R) and a capacitance value (C) of the time constant setting portion 42 connected to the control node ND_CTR. That is, the time constant represents a time required for the voltage of the control node ND_CTR to reach about 63.2% of its maximum voltage value. The logic levels of the test enable signal TM_EN, the first test signal TM1 and the second test signal TM2 may not be limited to the above descriptions. That is, in some embodiments, the test enable signal TM_EN, the first test signal TM1 and the second test signal TM2 may be set to have diverse logic levels which are different from those described in the above embodiment.

Configurations of the second reference voltage generator 32, the first discharger 33 and the second discharger 34 will be described more fully hereinafter with reference to FIGS. 3, 4, 5 and 6.

Figure 3:
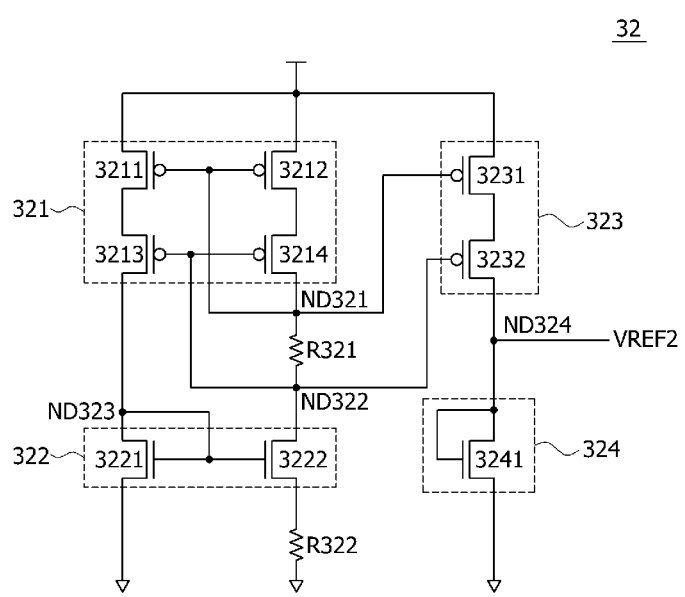
FIG. 3 is a circuit diagram illustrating a second reference voltage generator included in a period signal generation circuit shown in FIG. 2 according to an embodiment of the present invention.

As illustrated in FIG. 3, the second reference voltage generator 32 may be configured to include a first current source 321, a second current source 322, a reference voltage driver 323, a linearity controller 324, and resistors R321 and R322. The first current source 321 may operate as a constant current source in response to a voltage of a node ND321 and a voltage of a node ND322, thereby supplying charges to the node ND321. In an embodiment, the first current source 321 includes two sets of two PMOS transistors connected in series. The node ND321 and the node ND322 are electrically connected to a gate of the upper PMOS transistors 3211 and 3212 and of the lower PMOS transistors 3213 and 3214 of each set, respectively.

The second current source 322 may operate as a constant current source in response to a voltage of a node ND323, thereby discharging the node ND322. In an embodiment, the second current source 322 includes two NMOS resistors 3221 and 3222. The left NMOS transistor 3221 of the second current source 322 is a saturated MOS transistor whose gate is connected to the node ND323. The right NMOS transistor 3222 is electronically connected to a ground voltage through the resistor R322. The node ND321 and the node ND322 are electrically connected by the resistor R321.

The reference voltage driver 323 is configured to output the second reference voltage signal VREF2. In an embodiment, the reference voltage driver 323 includes two PMOS transistors connected in series. The linearity controller 324 may be electrically connected to an output node of the reference voltage driver 323. The second reference voltage signal VREF2 may be outputted from a node ND324 between the reference voltage driver 323 and the linearity controller 324, i.e., via the output node of the reference voltage driver 323. In an embodiment, the linearity controller 324 includes a diode element 3241 composed of a saturated MOS transistor.

In an operation, the NMOS transistor 3222 in the second current source 322 connecting the node ND322 and the resistor R322 may operate in the weak inversion mode and a current flowing through the NMOS transistor 3222 may be increased in proportion to the internal temperature. Because a level of the current flowing through the NMOS transistor 3222 may be substantially the same as a level of a variable current entering into the output node ND324 of the second reference voltage, the level of the variable current entering into the node ND324 may be also increased in proportion to the internal temperature. The level of the current flowing through the reference voltage driver 323 via the node ND324 may be adjusted by changing the resistor R322 and the beta ratio of the NMOS transistors 3221 and 3222 in the second current source 322.

On the other hand, a level of the variable current discharged from the output node ND324 of the second reference voltage through the saturated MOS transistor 3241 may be increased in proportion to the internal temperature, because the threshold voltage of the saturated MOS transistor 3241 is decreased with an increase of the internal temperature. A slope of the variable current discharged from the output node ND324 may be controlled by adjusting a size (e.g., a ratio of a channel width to a channel length) of the saturated MOS transistor 3241.

As a result, when the levels of the variable currents discharged from and entering into the output node ND324 are substantially equal to each other, a level of the second reference voltage signal VREF2 may be maintained constant regardless of a variation in the internal temperature. When the level of the variable current discharged from the output node ND324 is smaller than that of the variable current entering into the output node ND324, the second reference voltage signal VREF2 outputted from the second reference voltage generator 32 is increased in proportion to the internal temperature, and vice versa. In this way, the second reference voltage signal VREF2 outputted from the second reference voltage generator 32 may have a constant voltage level regardless of the variation in the internal temperature, or a variable voltage level that varies linearly with the internal temperature.

Figure 4:
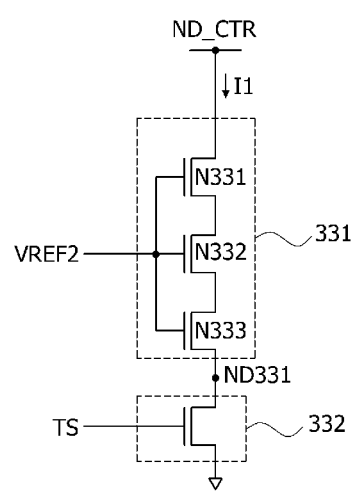
FIG. 4 is a circuit diagram illustrating a first discharger included in a period signal generation circuit shown in FIG. 2 according to an embodiment of the present invention.

FIG. 4 illustrates the first discharger 33 that is configured to generate the first current I1 when the internal temperature is below a predetermined temperature (e.g., 45 degrees Celsius) according to an embodiment of the present invention. The first discharger 33 may be configured to include a switching portion 331 and an activating portion 332. The switching portion 331 may include NMOS transistors N331, N332 and N333 which are turned on when the second reference voltage signal VREF2 is applied to gates of the NMOS transistors N331, N332 and N333. When the second reference voltage signal VREF2 is applied to the gates of the NMOS transistors N331, N332 and N333, charges stored in the control node ND_CTR may be discharged through the NMOS transistors N331, N332 and N333 to generate the first current I1 flowing from the control node ND_CTR toward a node ND331. When the temperature signal TS has a logic "high" state representing that the internal temperature is below the predetermined temperature (e.g., 45 degrees Celsius), the activating portion 332 may electrically connect the node ND331 to a ground voltage terminal to activate the operation of the switching portion 331. As a result, the first discharger 33 may generate the first current I1 which is from the charges discharged from the control node ND_CTR when the internal temperature is below a predetermined temperature.

Figure 5:
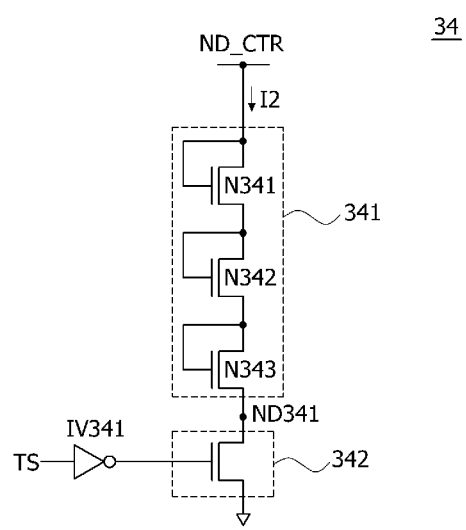
FIG. 5 is a circuit diagram illustrating a second discharger included in a period signal generation circuit shown in FIG. 2 according to an embodiment of the present invention.

FIG. 5 illustrates the second discharger 34 that is configured to generate the second current I2 when the internal temperature is equal to or greater than the predetermined temperature (e.g., 45 degrees Celsius) according to an embodiment of the present invention. The second discharger 34 may be configured to include a diode portion 341 and an activating portion 342. The diode portion 341 may include saturated NMOS transistors N341, N342 and N343 which are serially connected to each other, thereby providing an electrical path connected to the control node ND_CTR. The charges stored in the control node ND_CTR may be discharged through the saturated NMOS transistors N341, N342 and N343 to generate the second current I2 flowing from the control node ND_CTR toward a node ND341 when the temperature signal TS has a logic "low" state representing that the internal temperature is equal to or greater than the predetermined temperature. The activating portion 342 may electrically connect the node ND341 to a ground voltage terminal to activate the operation of the diode portion 341 when the temperature signal TS is "low" since it is converted to "high" by the inverter IV341. That is, the second discharger 34 may generate the second current I2 based on the charges discharged from the control node ND_CTR when the internal temperature is equal to or greater than the predetermined temperature (e.g., 45 degrees Celsius).

Figure 6:
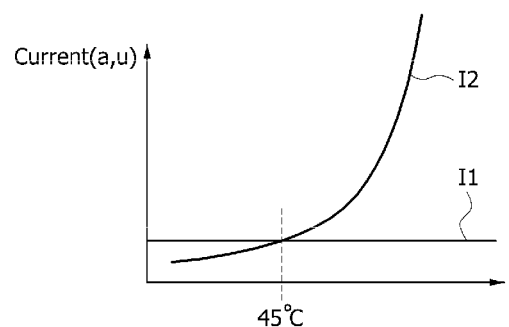
FIG. 6 is a graph illustrating discharge current characteristics of first and second dischargers shown in FIGS. 4 and 5 as a function of an internal temperature of a period signal generation circuit shown in FIG. 2 according to an embodiment of the present invention.

Referring to FIG. 6, the first current I1 discharged through the first discharger 33 and the second current I2 discharged through the second discharger 34 may be plotted as a function of the internal temperature. That is, the first current I1 may be constant or uniform regardless of a variation in the internal temperature. However, in some embodiments, the first current I1 may linearly increase or decrease according to a variation in the internal temperature. The second current I2 may nonlinearly vary with the internal temperature.

Figure 7:
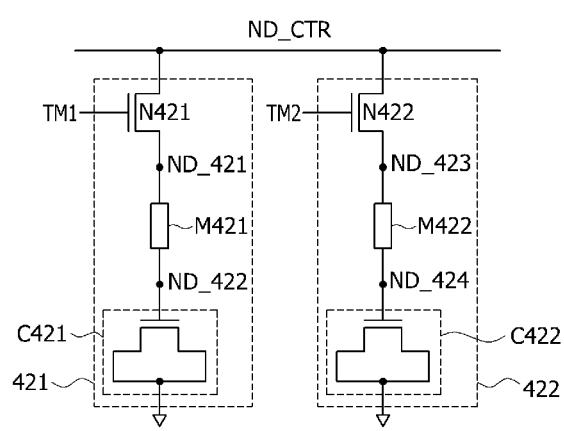
FIG. 7 is a circuit diagram illustrating a time constant setting portion included in a period signal generation circuit shown in FIG. 2 according to an embodiment of the present invention.

FIG. 7 illustrates a configuration of the time constant setting portion 42 according to an embodiment of the present invention. The time constant setting portion 42 may be configured to set a time constant of the time constant setting portion 42 by controlling charging and discharging speeds of the control node ND_CTR. The time constant setting portion 42 may include a first capacitance setting portion 421 and a second capacitance setting portion 422 which are connected to the control node ND_CTR in parallel. The first capacitance setting portion 421 may include an NMOS transistor N421, a metal option unit M421 and a capacitor C421 which are serially connected to each other. The NMOS transistor N421 may electrically connect the control node ND_CTR to a node ND421 and may operate as a switching element which is turned on in response to the first test signal TM1. The metal option unit M421 may electrically connect the node ND421 to a node ND422, and the capacitor C421 may electrically connect the node ND422 to a ground voltage terminal. Similarly, the second capacitance setting portion 422 may also include an NMOS transistor N422, a metal option unit M422 and a capacitor C422 which are serially connected to each other. The NMOS transistor N422 may electrically connect the control node ND_CTR to a node ND423 and may operate as a switching element which is turned on in response to the second test signal TM2. The metal option unit M422 may electrically connect the node ND423 to a node ND424, and the capacitor C422 may electrically connect the node ND424 to a ground voltage terminal.

During a test mode, if the test enable signal TM_EN is "high," the first and second test signals TM1 and TM2 are sequentially counted from a logic "low, low" state to "high, high" state. In response to a combination of the levels of the first and second test signals TM1 and TM2, the NMOS transistors N421 and N422 whose gates are electrically connected to the first and second test signals TM1 and TM2 respectively are turned on or off. As a result, a time constant of the time constant setting portion 42 may be changed by electrically connecting or disconnecting the capacitors C421 and C422 to the control node ND_CTR. After the test mode, when both the first and second test signals TM1 and TM2 have a logic "high" state, electrical connections in the metal option units M421 and M422 may be adjusted to generate an appropriate combination of the levels of the first and second test signals TM1 and TM2 for setting a predetermined time constant of the time constant setting portion 42.

The number of the test signals TM1 and TM2 are not limited to the example provided above. In other embodiments, a different number of the test signals may be used to adjust a time constant of the time constant setting portion 42. In these cases, the number of capacitance setting portions in the time constant setting portion 42 may be different from that described in the above embodiment.

The operations of the period signal generation circuit for generating the period signal PSRF will be described in more detail hereinafter for a case where the internal temperature is below the predetermined temperature (e.g., 45 degrees Celsius) and a case where the internal temperature equal to or over the predetermined temperature (e.g., 45 degrees Celsius).

Figure 8:
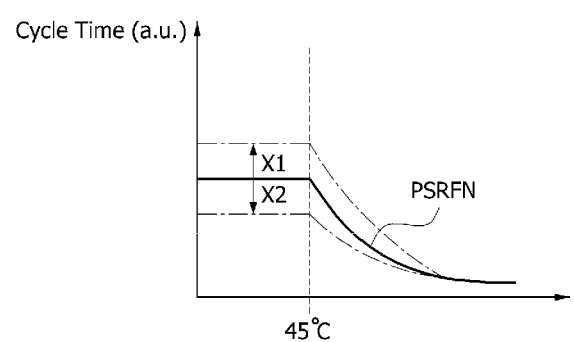
FIG. 8 is a graph illustrating cycle times of a period signal outputted from a period signal generation circuit of FIG. 2 as a function of an internal temperature of a period signal generation circuit shown in FIG. 2 according to an embodiment of the present invention.

First, if the internal temperature is below the predetermined temperature (e.g., 45 degrees Celsius), the temperature signal TS may have a logic "high" state. The activating portion 332 of the first discharger 33 (see FIG. 4) is enabled while the activating portion 342 of the second discharger 34 (see FIG. 5) is not enabled. In such a case, the control node ND_CTR may be charged by the activation of the driver 23 (see FIG. 2) if the voltage of the control node ND_CTR is lower than the first reference voltage (a voltage of the first reference voltage signal VREF1) and may be discharged by the activation of the first discharger 33 if the voltage of the control node ND_CTR is higher than the first reference voltage (a voltage of the first reference voltage signal VREF1). Since the first current I1 flowing through the first discharger 33 is constant if the internal temperature is below the predetermined temperature, a level transition period of the comparison signal COM may be constant. Accordingly, the period (e.g., a cycle time) of the period signal PSRF may be constant when the internal temperature is below the predetermined temperature (e.g., 45 degrees Celsius), as illustrated in FIG. 8.

Next, if the internal temperature is equal to or greater than the predetermined temperature (e.g., 45 degrees Celsius), the temperature signal TS may have a logic "low" state. The activating portion 342 of the second discharger 34 (see FIG. 5) is enabled while the activating portion 332 of the first discharger 33 (see FIG. 4) is not enabled. In such a case, the control node ND_CTR may be charged by the activation of the driver 23 if the voltage of the control node ND_CTR is lower than the first reference voltage (a voltage of the first reference voltage signal VREF1) and may be discharged by the activation of the second discharger 33 if the voltage of the control node ND_CTR is higher than the first reference voltage (a voltage of the first reference voltage signal VREF1). The second current I2 flowing through the second discharger 34 may be nonlinearly (e.g., exponentially) increased as the internal temperature increases over the predetermined temperature. Thus, a level transition period of the comparison signal COM may be nonlinearly reduced as the internal temperature increases over the predetermined temperature. Therefore, the period (e.g., a cycle time) of the period signal PSRF may be nonlinearly reduced as the internal temperature increases over the predetermined temperature (e.g., 45 degrees Celsius), as illustrated in FIG. 8.

The period signal PSRF generated in the period signal generation circuit described above may be applicable to self-refresh circuits or other circuits that periodically operate. The period signal generation circuit according to an embodiment of the present invention may be realized without circuits for generating a plurality of oscillation signals and for comparing the plurality of the oscillation signals. Thus, the period signal generation circuit may be simplified to increase the integration density thereof. In addition, the period signal generation circuit according to an embodiment of the present invention may operate without comparison of oscillating signals, thereby preventing malfunction resulted from comparison of the plurality of oscillation signals having similar periods. As a result, the period signal generation circuit according to the present embodiment may stably operate.

Moreover, the period signal generation circuit according to the present embodiment may execute a test operation by which a charging speed and/or a discharging speed of the control node ND_CTR can be controlled. Thus, the period (e.g., a cycle time) of the period signal may be readily adjusted without changing a circuit design. That is, as illustrated in FIG. 8, the period (e.g., a cycle time) of the period signal may be adjusted by increasing the period of the period signal by "X1" or decreasing the period of the period signal by "X2" according to a combination of the levels of the first and second test signals TM1 and TM2 during a test mode. After the test mode, the period (e.g., a cycle time) of the period signal may be adjusted by changing the connections of the metal option units M421 and M422 (see FIG. 7).

Figure 9:
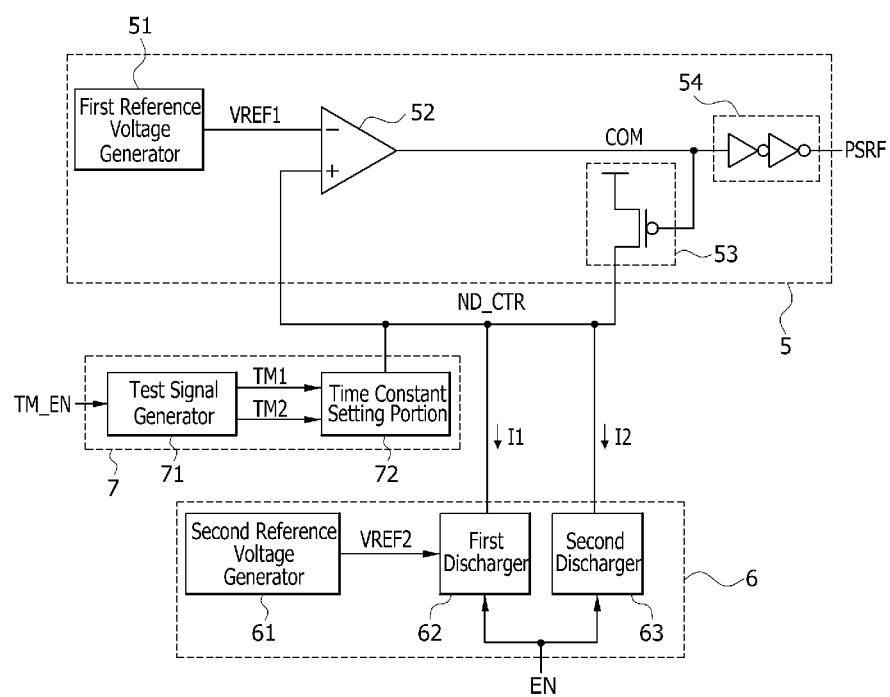
FIG. 9 illustrates a configuration of a period signal generation circuit according to another embodiment of the present invention.

FIG. 9 illustrates a configuration of a period signal generation circuit according to another embodiment of the present invention.

As illustrated in FIG. 9, a period signal generation circuit according to the present embodiment may be configured to include a period signal generator 5, a discharge controller 6 and a tester 7.

The period signal generator 5 may include a first reference voltage generator 51, a comparator 52, a driver 53 and a buffer 54. The first reference voltage generator 51 may generate a first reference voltage signal VREF1 having a first reference voltage with a constant level. The comparator 52 may compare a signal (e.g., a voltage signal) induced at a control node ND_CTR with the first reference voltage signal VREF1 to generate a comparison signal COM. The buffer 54 is configured to buffer the comparison signal COM to generate a period signal PSRF. The buffer 54 may be a plurality of inverters and/or other components suitable for buffering and generating the period signal PSRF. The period signal generator 5 may have the same configuration as the period signal generator 2 illustrated in FIG. 2. Thus, to avoid duplicate explanation, further detailed descriptions to the period signal generator 5 will be omitted in this embodiment.

The discharge controller 7 is configured to discharge the charges stored in the control node ND_CTR as needed. In an embodiment, the discharge controller 6 may include a second reference voltage generator 61, a first discharger 62 and a second discharger 63. The second reference voltage generator 61 may generate a second reference voltage signal VREF2 having a variable voltage level that linearly increases or decreases according to variation of the internal temperature. The first discharger 62 may generate a first current I1, which is discharged from the control node ND_CTR, in response to the second reference voltage signal VREF2. The first current I1 may linearly decrease as the internal temperature increases. The second discharger 63 may generate a second current I2, which is discharged from the control node ND_CTR. The second current I2 may nonlinearly increase as the internal temperature increases.

In an operation, both the first and second dischargers 62 and 63 may simultaneously operate in response to an enable signal EN to generate the first and second currents I1 and I2 from the control node ND_CTR. The enable signal EN may be enabled to have a logic "high" state, thereby generating a period signal PSRF. When the internal temperature is below a predetermined temperature (e.g., 45 degrees Celsius), a sum of the first and second currents I1 and I2 may be substantially constant. This is because the second current I2 shows an approximately linear behavior when the internal temperature is below the predetermined temperature. In this region, the second current I2 is increased linearly when the internal temperature increases. As the first current I1 is decreased linearly as the internal temperature increases in the same region, the sum of the first and second currents I1 and I2 may be constant if the linearly decreasing slope of the first current I1 matches the correspondingly increasing slope of the second current I2. On the other hand, when the internal temperature is equal to or greater than the predetermined temperature (e.g., 45 degrees Celsius), the sum of the first and second currents I1 and I2 may be nonlinearly increased as the internal temperature increases. This is because the second current I2 increases nonlinearly with a faster rate (e.g., exponentially) than the linearly decreasing rate of the first current I1 so that the nonlinearly increasing behavior of the second current I2 dominates the linearly decreasing behavior of the first current, when the internal temperature increases over the predetermined temperature. The second reference voltage generator 61 may have the same configuration as the second reference voltage generator 32 illustrated in FIG. 3. Thus, to avoid duplicate explanation, further detailed descriptions to the second reference voltage generator 61 will be omitted in this embodiment.

The tester 7 may include a test signal generator 71 and a time constant setting portion 72. The test signal generator 71 may generate a first test signal TM1 and a second test signal TM2 in response to a test enable signal TM_EN. If the test enable signal TM_EN has an enabling state (e.g., a logic high) during a test mode, the test signal generator 71 may generate the first and second test signals TM1 and TM2 which are sequentially counted from a logic "low, low" state to "high, high" state. If the test enable signal TM_EN has non-enabling state (e.g., a logic low) after the test mode, the test signal generator 71 may generate the first and second test signals TM1 and TM2 having a logic "high" state. The time constant setting portion 72 may control a charging speed in such a way that the voltage of the control node ND_CTR is pulled up to have a power supply voltage according to a time constant which is set by a combination of the first and second test signals TM1 and TM2. In addition, the time constant setting portion 72 may control a discharging speed in such a way that the voltage of the control node ND_CTR is pulled down by the discharge controller 6. As will be understood by those skilled in art, the logic levels of the test enable signal TM_EN, the first test signal TM1 and the second test signal TM2 are not limited to the above examples. The time constant setting portion 72 may have the same configuration as the time constant setting portion 42 illustrated in FIG. 7. Thus, to avoid duplicate explanation, further detailed descriptions to the time constant setting portion 72 will be omitted in this embodiment.

Configurations of the first discharger 62 and the second discharger 63 will be described more fully hereinafter with reference to FIGS. 10, 11 and 12.

Figure 10:
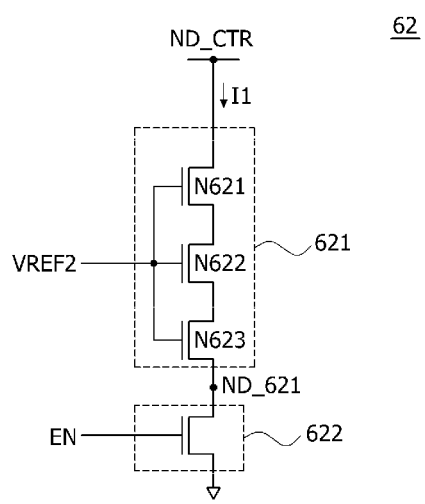
FIG. 10 is a circuit diagram illustrating a first discharger included in a period signal generation circuit shown in FIG. 9 according to an embodiment of the present invention.

FIG. 10 illustrates the first discharger 62 that is configured to include a switching portion 621 and an activating portion 622 according to an embodiment of the present invention. The switching portion 621 may include NMOS transistors N621, N622 and N623 which are turned on when the second reference voltage signal VREF2 is applied to gates of the NMOS transistors N621, N622 and N623. When the second reference voltage signal VREF2 is applied to the gates of the NMOS transistors N621, N622 and N623, charges stored in the control node ND_CTR may be discharged through the NMOS transistors N621, N622 and N623 to generate the first current I1 flowing from the control node ND_CTR towards a node ND621. In an embodiment, the first current I1 may be linearly decreased when a level of the second reference voltage signal VREF2 decreases with an increase of the internal temperature. When the enable signal EN has a logic "high" state, the activating portion 622 may electrically connect the node ND621 to a ground voltage terminal to activate the operation of the switching portion 621. As a result, the first discharger 62 may generate the first current I1 from the charges discharged from the control node ND_CTR when the enable signal EN has the logic "high" state.

Figure 11:
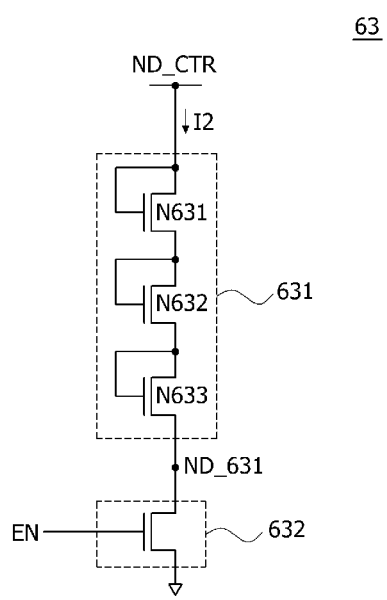
FIG. 11 is a circuit diagram illustrating a second discharger included in a period signal generation circuit shown in FIG. 9 according to an embodiment of the present invention.

FIG. 11 illustrates the second discharger 63 that is configured to generate the second current I2 when the enable signal EN has the logic "high" state according to an embodiment of the present invention. The second discharger 63 may be configured to include a diode portion 631 and an activating portion 632. The diode portion 631 may include saturated NMOS transistors N631, N632 and N633 which are serially connected to each other, thereby providing an electrical path connected to the control node ND_CTR. The charges stored in the control node ND_CTR may be discharged through the saturated NMOS transistors N631, N632 and N633 to generate the second current I2 from the control node ND_CTR towards a node ND631. In an embodiment, the second current I2 may be nonlinearly increased as the internal temperature increases because the threshold voltages of the saturated NMOS transistors N631, N632, and N633 are decreased. When the enable signal EN enable signal EN has a logic "high" state, the activating portion 632 may electrically connect the node ND631 to a ground voltage terminal to activate the operation of the diode portion 631. As a result, the second discharger 72 may generate the second current I2 from the charges discharged from the control node ND_CTR when the enable signal EN has the logic "high" state.

Figure 12:
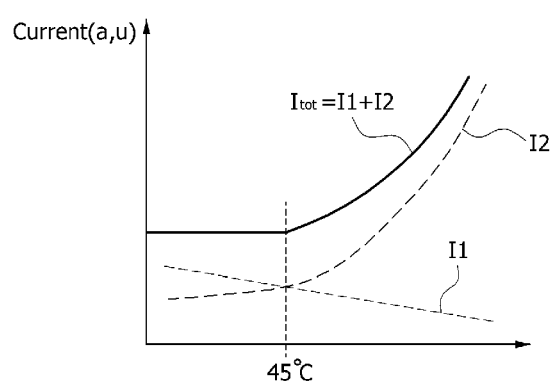
FIG. 12 is a graph illustrating discharge current characteristics of first and second dischargers shown in FIG. 9 as a function of an internal temperature according to an embodiment of the present invention.

Referring to FIG. 12, the first current I1 discharged through the first discharger 33 and the second current I2 discharged through the second discharger 34 may be plotted as a function of the internal temperature. That is, the first current I1 may linearly decrease as the internal temperature increases, and the second current I2 may nonlinearly (e.g., exponentially) increase as the internal temperature increases. A sum (e.g., a total current $I_{tot}$) of the first and second currents I1 and I2 may be substantially constant when the internal temperature is below the predetermined temperature (e.g., 45 degrees Celsius). This is because the second current I2 shows an approximately linear behavior when the internal temperature is below the predetermined temperature. In this region, the second current I2 is increased linearly when the internal temperature increases. As the first current I1 is decreased linearly as the internal temperature increases in the same region, the sum of the first and second currents I1 and I2 may be constant if the linearly decreasing slope of the first current I1 matches the correspondingly increasing slope of the second current I2. On the other hand, the total current $I_{tot}$ (i.e., the sum of the first and second currents I1 and I2) may be nonlinearly increased as the internal temperature increases over the predetermined temperature (e.g., 45 degrees Celsius). This is because the second current I2 increases nonlinearly with a faster rate (e.g., exponentially) than the linearly decreasing rate of the first current I1 so that the nonlinearly increasing behavior of the second current I2 dominates the linearly decreasing behavior of the first current, when the internal temperature increases over the predetermined temperature.

The operations of the period signal generation circuit according to the present embodiment will be described in more detail hereinafter when the internal temperature is below the predetermined temperature (e.g., 45 degrees Celsius) and when the internal temperature is equal to or over the predetermined temperature (e.g., 45 degrees Celsius).

First, when the internal temperature is below the predetermined temperature (e.g., 45 degrees Celsius), the control node ND_CTR may be charged by the activation of the driver 53 (see FIG. 9) if the voltage of the control node ND_CTR is lower than the first reference voltage (a voltage of the first reference voltage signal VREF1) and may be discharged by the activation of the first and second dischargers 62 and 63 (see FIG. 9) if the voltage of the control node ND_CTR is higher than the first reference voltage (a voltage of the first reference voltage signal VREF1). When the internal temperature is below the predetermined temperature (e.g., 45 degrees Celsius), the total current $I_{tot}$ (i.e., the sum of the first and second currents I1 and I2) discharged by the first and second dischargers 62 and 63 (see FIG. 9) may be substantially constant. Thus, the period signal PSRF may be constant when the internal temperature is below the predetermined temperature.

Next, when the internal temperature is equal to or over the predetermined temperature (e.g., 45 degrees Celsius), the total current $I_{tot}$ (i.e., the sum of the first and second currents I1 and I2) discharged by the first and second dischargers 62 and 63 (see FIG. 9) may be nonlinearly increased as the internal temperature increases. Since a level transition period of the period signal PSRF is inversely proportional to the total current $I_{tot}$, the period (e.g., a cycle time) of the period signal PSRF may be nonlinearly reduced as the internal temperature increases over the predetermined temperature (e.g., 45 degrees Celsius).

The period signal PSRF generated in the period signal generation circuit described above may be applicable to self-refresh circuits or other circuits that periodically operate. The period signal generation circuit according to an embodiment of the present invention may be implemented without any temperature sensors or circuits for generating a plurality of oscillation signals and for comparing the plurality of oscillation signals. Thus, the period signal generation circuit may be simplified to increase the integration density thereof. Further, the period signal generation circuit according to the embodiment of the present embodiment may operate without comparison of oscillating signals, thereby preventing a malfunction resulted from comparing the oscillating signals having similar periods. As a result, the period signal generation circuit according to the present embodiment may stably operate.

Moreover, the period signal generation circuit according to the embodiment of the present invention may execute a test operation that can control a charging speed and/or a discharging speed of the control node ND_CTR. Thus, the period (e.g., a cycle time) of the period signal may be more readily adjusted without changing a circuit design.

The example embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A period signal generation circuit comprising:
   a control node;
   a period signal generator configured to generate a period signal by alternately charging and discharging the control node according to a potential level of the control node;
   a discharge controller configured to discharge a first current having a substantially constant value from the control node in response to a temperature signal and discharge a second current varying according to an internal temperature thereof from the control node in response to the temperature signal; and
   a tester configured to control a charging speed or a discharging speed, or both, of the control node.

2. The period signal generation circuit of claim 1, wherein the period signal generation circuit is part of a semiconductor memory device and the period signal is used to refresh memory cells in the semiconductor memory device.

3. The period signal generation circuit of claim 2, wherein the semiconductor memory device is provided in a package and the internal temperature corresponds to a temperature within the package.

4. The period signal generation circuit of claim 1, wherein the second current is nonlinearly increased as the internal temperature increases.

5. The period signal generation circuit of claim 4, wherein the discharge controller includes:
   a first discharger coupled to the control node and configured to discharge the control node in response to the temperature signal to generate the first current flowing through the first discharger; and
   a second discharger coupled to the control node and configured to discharge the control node in response to the temperature signal to generate the second current flowing through the second discharger,
   wherein one of the first and second dischargers is configured to be selectively enabled in response to the temperature signal that transitions from one level to another level if the internal temperature reaches a predetermined temperature.

6. The period signal generation circuit of claim 5, wherein the first discharger includes:
   a switching portion configured to be turned on in response to a second reference voltage signal and generate the first current based on charges discharged from the control node; and
   an activating portion configured to activate the switching portion in response to the temperature signal.

7. The period signal generation circuit of claim 6, wherein the switching portion includes at least one MOS transistor which is turned on when the second reference voltage signal is applied to a gate of the at least one MOS transistor.

8. The period signal generation circuit of claim 6, wherein the second reference voltage signal has a substantially constant voltage level regardless of a variation in the internal temperature or a variable voltage level that varies linearly with the internal temperature.

9. The period signal generation circuit of claim 8, further comprising a reference voltage generator for generating the second reference voltage signal, wherein the reference voltage generator includes:
   a first resistor coupling a first node to a second node;
   a first current source providing a substantially constant current flow in response to voltages of the first and second nodes;
   a second current source coupled to the second node to providing a substantially constant current flow in response to a voltage of a third node;
   a second resistor coupled to the second current source;
   a reference voltage driver for driving the second reference voltage signal in response to the voltages of the first and second nodes; and
   a linearity controller electrically coupled to an output node of the reference voltage driver,
   wherein the second reference voltage signal is outputted through the output node of the reference voltage driver.

10. The period signal generation circuit of claim 5, wherein the second discharger includes:
    a diode portion configured to have at least one diode element to generate the second current discharged from the control node; and
    an activating portion configured to activate the diode portion in response to the temperature signal.

11. The period signal generation circuit of claim 1, wherein the period signal generator pulls up a voltage of the control node to a power supply voltage if the control node has a lower voltage level than a first reference voltage.

12. The period signal generation circuit of claim 11, wherein the period signal generator includes:
    a comparator configured to compare the voltage of the control node with the first reference voltage to generate a comparison signal;
    a driver configured to pull up the voltage of the control node to the power supply voltage in response to the comparison signal; and
    a buffer configured to buffer the comparison signal to generate the period signal, wherein the period signal generation circuit is part of a dynamic random access memory (DRAM) device and the period signal is used to refresh memory cells in the DRAM device.

13. The period signal generation circuit of claim 1, wherein the tester includes:
   a test signal generator configured to generate a first test signal and a second test signal in response to a test enable signal; and
   a time constant setting portion connected to the control node to set a time constant in response to the first and second test signals.

14. The period signal generation circuit of claim 13:
   wherein the test signal generator generates the first and second test signals which are sequentially counted when the test enable signal is enabled; and
   wherein the test signal generator generates the first and second test signals which have a predetermined logic state when the test enable signal is disabled.

15. The period signal generation circuit of claim 13, wherein the time constant setting portion includes:
   a first capacitance setting portion coupling a first capacitor to the control node in response to the first test signal; and
   a second capacitance setting portion coupling a second capacitor to the control node in response to the second test signal.

16. The period signal generation circuit of claim 15, wherein the first capacitance setting portion includes:
   a first switching element that is turned on in response to the first test signal to couple the control node to a first node;
   a first metal option unit coupling the first node to a second node; and
   the first capacitor coupling the second node to a ground voltage terminal.

17. The period signal generation circuit of claim 15, wherein the second capacitance setting portion includes:
   a second switching element that is turned on in response to the second test signal to couple the control node to a third node;
   a second metal option unit coupling the third node to a fourth node; and
   the second capacitor coupling the fourth node to a ground voltage terminal.

18. A period signal generation circuit comprising:
   a period signal generator configured to generate a period signal by alternately charging and discharging a control node according to a potential level of the control node;
   a discharge controller configured to generate a first current and a second current discharged from the control node; and
   a tester configured to control a charging speed or a discharging speed, or both, of the control node,
   wherein a total current of the first and second currents is substantially constant when an internal temperature of the discharge controller is below a predetermined temperature, and the total current of the first and second currents varies as the internal temperature increases above the predetermined temperature.

19. The period signal generation circuit of claim 18, wherein the period signal generation circuit is part of a semiconductor memory device and the period signal is used to refresh memory cells in the semiconductor memory device.

20. The period signal generation circuit of claim 19, wherein the semiconductor memory device is provided in a package and the internal temperature corresponds to a temperature within the package.

21. The period signal generation circuit of claim 18, wherein the first current is linearly decreased as the internal temperature increases.

22. The period signal generation circuit of claim 21, wherein the second current is nonlinearly increased as the internal temperature increases.

23. The period signal generation circuit of claim 22, wherein the total current of the first and second currents is nonlinearly increased as the internal temperature increases above the predetermined temperature.

24. The period signal generation circuit of claim 18, wherein the period signal generator pulls up a voltage of the control node to a power supply voltage when the control node has a lower voltage level than a first reference voltage.

25. The period signal generation circuit of claim 24, wherein the period signal generator includes:
   a comparator configured to compare the voltage of the control node with the first reference voltage to generate a comparison signal;
   a driver configured to pull up the voltage of the control node to the power supply voltage in response to the comparison signal; and
   a buffer configured to buffer the comparison signal to generate the period signal,
   wherein the period signal generation circuit is part of a dynamic random access memory (DRAM) device and the period signal is used to refresh memory cells in the DRAM device.

26. The period signal generation circuit of claim 18, wherein the discharge controller includes:
   a first discharger coupled to the control node and configured to discharge the control node in response to an enable signal to generate the first current flowing through the first discharger; and
   a second discharger coupled to the control node and configured to discharge the control node in response to the enable signal to generate the second current flowing through the second discharger.

27. The period signal generation circuit of claim 26, wherein the first discharger includes:
   a switching portion configured to be turned on in response to a second reference voltage signal to generate the first current discharged from the control node; and
   an activating portion configured to activate the switching portion in response to the enable signal.

28. The period signal generation circuit of claim 27, wherein the switching portion includes at least one MOS transistor which is turned on when the second reference voltage signal is applied to a gate of the at least one MOS transistor.

29. The period signal generation circuit of claim 27, wherein the second reference voltage signal has a variable voltage level that linearly decreases as the internal temperature increases.

30. The period signal generation circuit of claim 29, further comprising a reference voltage generator for generating the second reference voltage signal, wherein the reference voltage generator includes:
   a first resistor coupling a first node to a second node;
   a first current source providing a substantially constant current flow in response to voltages of the first and second nodes;
   a second current source coupled to the second node and providing a substantially constant current flow in response to a voltage of a third node;
   a second resistor coupled to the second current source;

a reference voltage driver for driving the second reference voltage signal in response to the voltages of the first and second nodes; and a linearity controller electrically coupled to an output node of the reference voltage driver, wherein the second reference voltage signal is outputted through the output node of the reference voltage driver.

31. The period signal generation circuit of claim 26, wherein the second discharger includes:

a diode portion configured to have at least one diode element to generate the second current discharged from the control node; and an activating portion configured to activate the diode portion in response to the enable signal.

32. The period signal generation circuit of claim 18, wherein the tester includes:

a test signal generator configured to generate a first test signal and a second test signal in response to a test enable signal; and a time constant setting portion coupled to the control node to set a time constant in response to the first and second test signals.

33. The period signal generation circuit of claim 32:

wherein the test signal generator generates the first and second test signals which are sequentially counted when the test enable signal is enabled; and wherein the test signal generator generates the first and second test signals which have a predetermined logic state when the test enable signal is disabled.

34. The period signal generation circuit of claim 32, wherein the time constant setting portion includes:

a first capacitance setting portion coupling a first capacitor to the control node in response to the first test signal; and a second capacitance setting portion coupling a second capacitor to the control node in response to the second test signal.

35. The period signal generation circuit of claim 34, wherein the first capacitance setting portion includes:

a first switching element that is turned on in response to the first test signal to couple the control node to a first node;

a first metal option unit coupling the first node to a second node; and the first capacitor coupling the second node to a ground voltage terminal.

36. The period signal generation circuit of claim 34, wherein the second capacitance setting portion includes:

a second switching element that is turned on in response to the second test signal to couple the control node to a third node;

a second metal option unit coupling the third node to a fourth node; and the second capacitor coupling the fourth node to the ground voltage terminal.

* * * * *